(12) United States Patent
Akutsu

(10) Patent No.: US 6,989,888 B2
(45) Date of Patent: Jan. 24, 2006

(54) STAGE SYSTEM, EXPOSURE APPARATUS, AND DEVICE MANUFACTURING METHOD

(75) Inventor: Kotaro Akutsu, Soka (JP)

(73) Assignee: Canon Kabushiki Kaisha, Tokyo (JP)

( * ) Notice: Subject to any disclaimer, the term of this patent is extended or adjusted under 35 U.S.C. 154(b) by 11 days.

(21) Appl. No.: 10/862,382

(22) Filed: Jun. 8, 2004

(65) Prior Publication Data

US 2005/0018165 A1 Jan. 27, 2005

(30) Foreign Application Priority Data

Jun. 10, 2003 (JP) ........................................ 2003-165513

(51) Int. Cl.
  *G03B 27/58* (2006.01)
  *G03B 27/62* (2006.01)
  *H01L 21/00* (2006.01)

(52) U.S. Cl. .............................. 355/72; 355/75; 310/12

(58) Field of Classification Search .................. 355/53, 355/72–76; 310/10, 12; 318/640; 250/491.2
See application file for complete search history.

(56) References Cited

U.S. PATENT DOCUMENTS

| | | | |
|---|---|---|---|
| 5,382,095 A | 1/1995 | Akutsu | 384/100 |
| 5,726,548 A | 3/1998 | Chiba et al. | 318/625 |
| 5,858,587 A | 1/1999 | Yamane et al. | 430/22 |
| 5,864,142 A | 1/1999 | Muraki et al. | 250/491.1 |
| 5,864,389 A * | 1/1999 | Osanai et al. | 355/53 |
| 5,939,852 A | 8/1999 | Akutsu et al. | 318/640 |
| 6,028,376 A | 2/2000 | Osanai et al. | 310/12 |
| 6,351,041 B1 * | 2/2002 | Okubo | 310/12 |
| 6,359,677 B2 | 3/2002 | Itoh et al. | 355/53 |
| 2004/0012765 A1 | 1/2004 | Akutsu et al. | 355/53 |
| 2004/0041101 A1 | 3/2004 | Akutsu | 250/491.1 |

FOREIGN PATENT DOCUMENTS

JP  9-330867  12/1997

* cited by examiner

*Primary Examiner*—Henry Hung Nguyen
(74) *Attorney, Agent, or Firm*—Fitzpatrick, Cella, Harper & Scinto

(57) ABSTRACT

A stage system that can meet enlargement of a stroke and thus, particularly, that can be suitably incorporated into an electron beam exposure apparatus. The stage system includes an X driving member (3) being movable along an X direction, a Y driving member (2) being movable along a Y direction, an X-Y movable member being movable in the Y direction relative to the X driving member, through a Y lateral static-pressure bearing (44), and also being movable in the X direction relative to the Y driving member through an X lateral static-pressure bearing, wherein a fluid discharged from the X lateral static-pressure bearing is combined with a fluid discharged from the Y lateral static-pressure bearing, and wherein the combined fluid is discharged from a discharging bore (53″) formed in the X driving member.

8 Claims, 13 Drawing Sheets

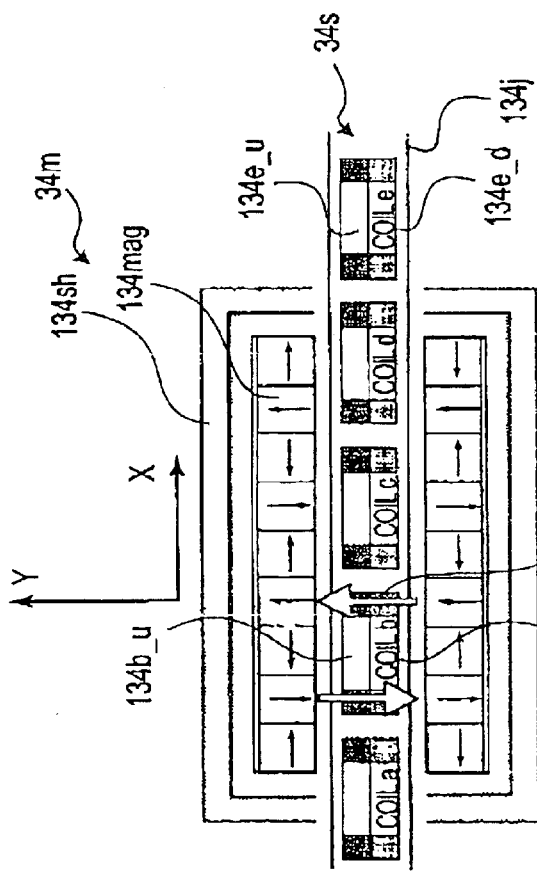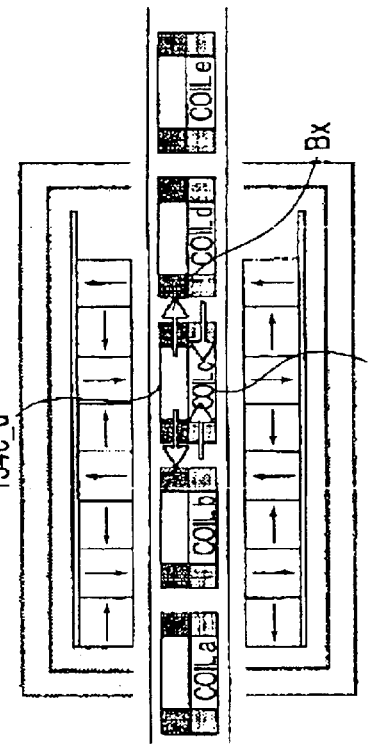
FIG.4A
FIG.4B

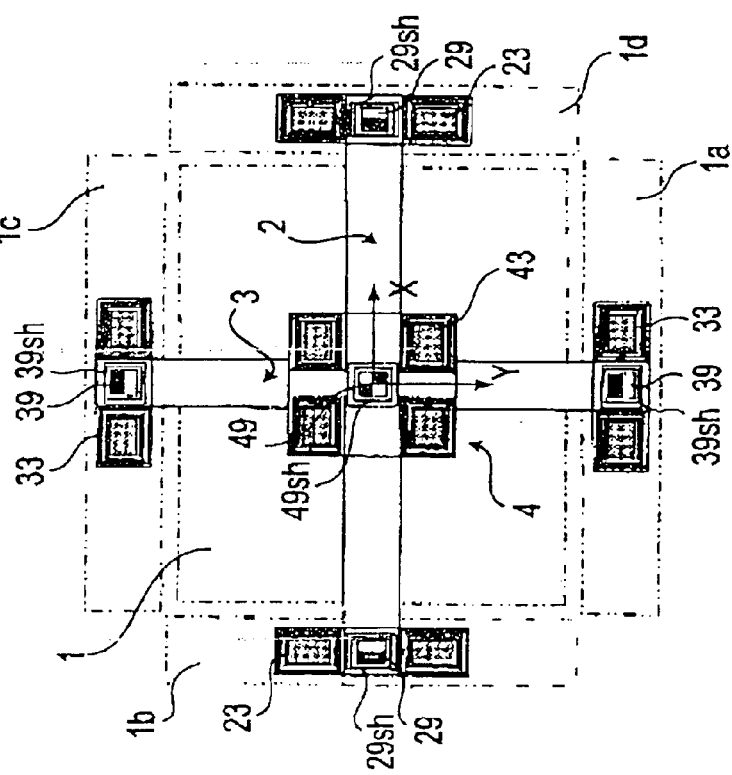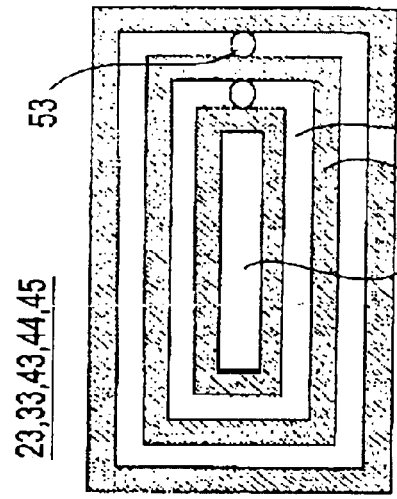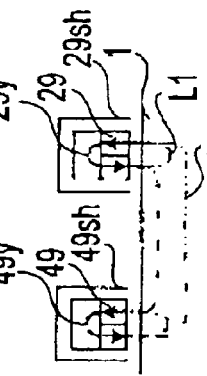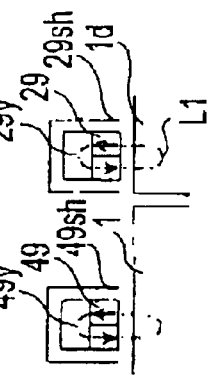

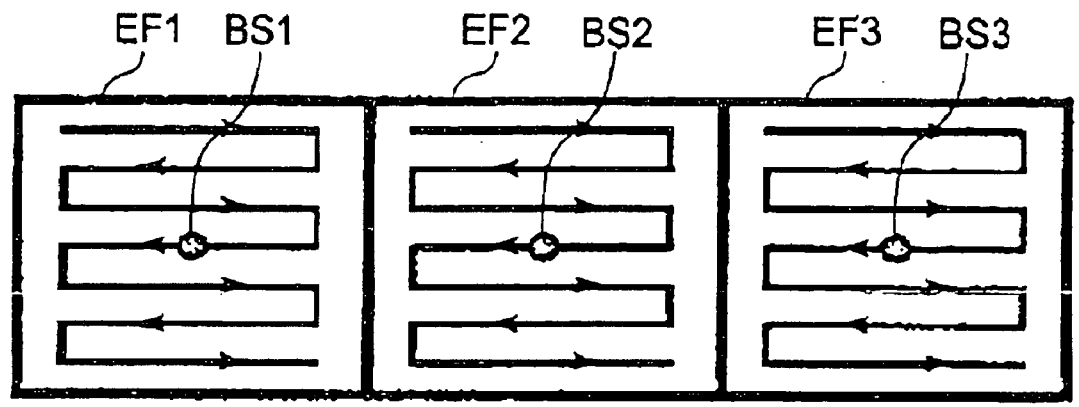
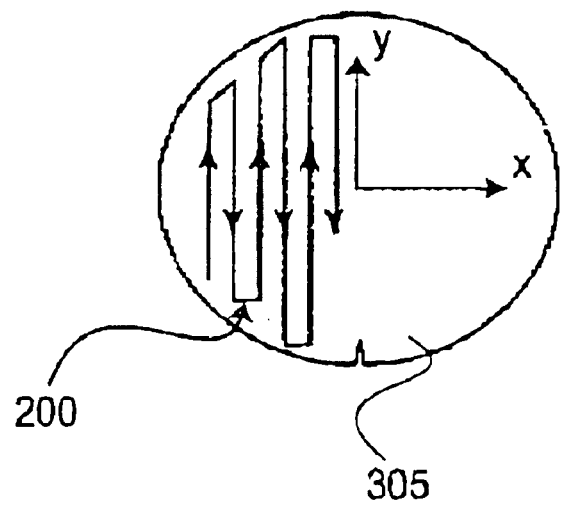
FIG. 12

STAGE SYSTEM, EXPOSURE APPARATUS, AND DEVICE MANUFACTURING METHOD

FIELD OF THE INVENTION AND RELATED ART

This invention relates to a stage system to be used in various measuring instruments, or in a projection exposure apparatus, for a semiconductor lithography process, for moving and positioning a substrate, such as a wafer, at a high speed and with a high precision. The stage system of the present invention is best suited for a stage system particularly to be used in an electron beam exposure apparatus, in which an electron beam is used to perform pattern drawing for direct patterning of a wafer or reticle exposure, or in an EUV (extreme ultraviolet) exposure apparatus using EUV light as exposure light in which the stage system is used in a vacuum ambience.

The manufacture of devices such as semiconductor devices, for example, is based on lithography technology in which various patterns formed on a mask are transferred to a wafer in a reduced scale, by use of light. Extremely high precision is required in relation to the mask pattern to be used in such lithography technology, and an electron beam exposure apparatus is used to make such a mask. Further, an electron beam exposure apparatus is used also in a case wherein a pattern is to be directly formed on a wafer without using a mask.

As regards such an electron beam exposure apparatus, there is a point beam type apparatus wherein an electron beam to be used is shaped into a spot-like shape, and a variable rectangle-beam type apparatus wherein an electron beam has a rectangular section of various size, for example. In these types of exposure apparatus, however, generally, the apparatus comprises an electron gun unit for producing an electron beam, an electron optical system for directing the produced electron beam to a sample, a stage system for scanningly moving the whole surface of the sample with respect to the electron beam, and an object deflector for positioning the electron beam upon the sample very precisely.

The region that can be positioned by use of an objective deflector has only a small size of about a few millimeters, to suppress the aberration of the electron optical system as much as possible. To the contrary, as regards the size of the sample, for a silicon wafer, it is about 200–300 mm diameter, and for a glass substrate to be used as a mask, it is about 150 mm square. So, the electron beam exposure apparatuses include a stage system by which the whole surface of the sample can be scanned with the electron beam.

In electron beam exposure apparatuses, since the positioning response of the electron beam is extraordinarily high, generally, they use a system in which the attitude of the stage or a positional deviation thereof is measured and the measured value is fed back to the positioning of the electron beam through the deflector, rather than attempting to improve the mechanical control characteristic of the stage. Also, since the stage is disposed in a vacuum chamber and, furthermore, there is a restriction that a change in magnetic field that may influence the positioning precision of the electron beam must be avoided, generally, the stage is disposed by use of limited elements of a contact type, such as rolling guides or ball screw actuators.

Such contact type elements involve a problem of lubrication or dust creation, for example. As measures for such problems, generally, an exhaust type air bearing such as shown in FIG. 10 is used. An air pad 51 is provided at the slider side, to support a guide without contact thereto. This air bearing comprises a non-contact seal 52L, an air gathering groove 52g provided inside the non-contact seal, and an exhaust bore 53 provided at the guide side in association with the groove 52, to thereby prevent leakage of air discharged from the air pad outwardly into an external ambience. With this structure, a non-contact guide can be accomplished even in a vacuum ambience.

As regards the election beam exposure apparatus, there is a known example disclosed in Japanese Laid-Open Patent Application No. H09-330867. In the apparatus of this document, a plurality of electron beams are projected upon the surface of a sample along design coordinates and the electron beams are deflected along the design coordinates to thereby scan the sample surface. Additionally, in accordance with a pattern to be drawn, the electron beams are individually turned on and off to thereby draw the pattern. In such a multiple electron-beam type exposure apparatus, a desired pattern can be drawn by use of plural electron beams, and thus, the throughput can be improved.

FIG. 11 illustrates a general structure of a multiple electron-beam type exposure apparatus. Denoted at 501a, 501b, and 501c are electron guns by which a plurality of electron beams can be individually turned on and off. Denoted at 100 is a reduction electron optical system for reducing and projecting the electron beams from the electron guns 501a, 501b and 501c, onto a wafer 305. Denoted at 306 is a deflector for scanning the plural electron beams projected to the wafer 305.

FIG. 12 illustrates the action as a wafer is scanned with plural electron beams, in the exposure apparatus of FIG. 11. White small circles depict beam reference positions BS1, BS2 and BS3 whereat the electron beams are incident, as they are not deflected by the deflector 306. These beam reference positions BS1–BS3 are placed along a design orthogonal coordinate system (Xs, Ys).

On the other hand, the electron beams are scanned (scanningly deflected) also along a design orthogonal coordinate system (Xs, Ys) while taking the beam reference positions as a reference, to scan associated exposure fields EF1, EF2 and EF3, respectively. In this state, the stage which carries the wafer 350 thereon is scanningly moved mainly in the Y direction, as denoted at 200 in FIG. 13, to perform sequential exposures of zones of the wafer.

SUMMARY OF THE INVENTION

However, in the example of FIG. 10, the length of the air gathering groove 52g corresponding to the stroke is definitely required, such that the slider length is restricted thereby. Also, as a result, the length of the guide is determined thereby.

Since enlargement of the wafer diameter is required in the lithography, enlargement of the stroke would cause an increase in the size of the apparatus itself and, as a result, it would cause an increase in the weight of the apparatus and in the volume of the chamber.

It is accordingly an object of the present invention to provide a high-precision stage system that meets enlargement of the stroke.

In accordance with an aspect of the present invention, to achieve the above object, there is provided a stage system, comprising a first driving member being movable along a first direction, a second driving member being movable along a second direction orthogonal to or approximately orthogonal to the first direction, a movable member being movable in a third direction orthogonal to or approximately orthogonal to the first and second directions and also in the second direction along a first guide surface provided on the first driving member, being parallel to or approximately parallel to the second direction, while being supported with respect to the first guide surface through a first static-pressure bearing, the movable member further being movable in the first direction along a second guide surface provided on the second movable member and being parallel to or approximately parallel to the third direction and the first direction, while being supported with respect to the second guide surface through a second static-pressure bearing, and fluid discharging means for combining a fluid discharged from the second static-pressure bearing with a fluid discharged from the first static-pressure bearing, and for discharging the combined fluid from a discharging bore formed in the first driving member.

In accordance with the present invention, a fluid discharged from the second static-pressure bearing, provided on the movable member while being disposed opposed to the second driving member, is combined with a fluid discharged from the first static-pressure bearing, which is provided on the movable member, while being disposed opposed to the first driving member. Then, the thus combined fluid is discharged from a discharging bore formed in the first driving member. With this arrangement, the size of the second static-pressure bearing in the first direction, being provided on the movable member, is not affected by the movement stroke of the movable member in the first direction.

As a result, high precision exposure that can meet a large stroke inside a vacuum ambience or an approximately vacuum ambience or, alternatively, a desired gas ambience, can be accomplished.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 4A and 4B are schematic views for explaining operation of a linear motor of the stage system of FIG. 2.

FIGS. 6A–6D are schematic views for explaining a base arrangement for supporting sliders in the stage system of FIG. 2.

FIG. 12 is a schematic view for explaining the action as a wafer is scanned with a plurality of electron beams, in the exposure apparatus of FIG. 11.

DESCRIPTION OF THE PREFERRED EMBODIMENTS

Figure 1:
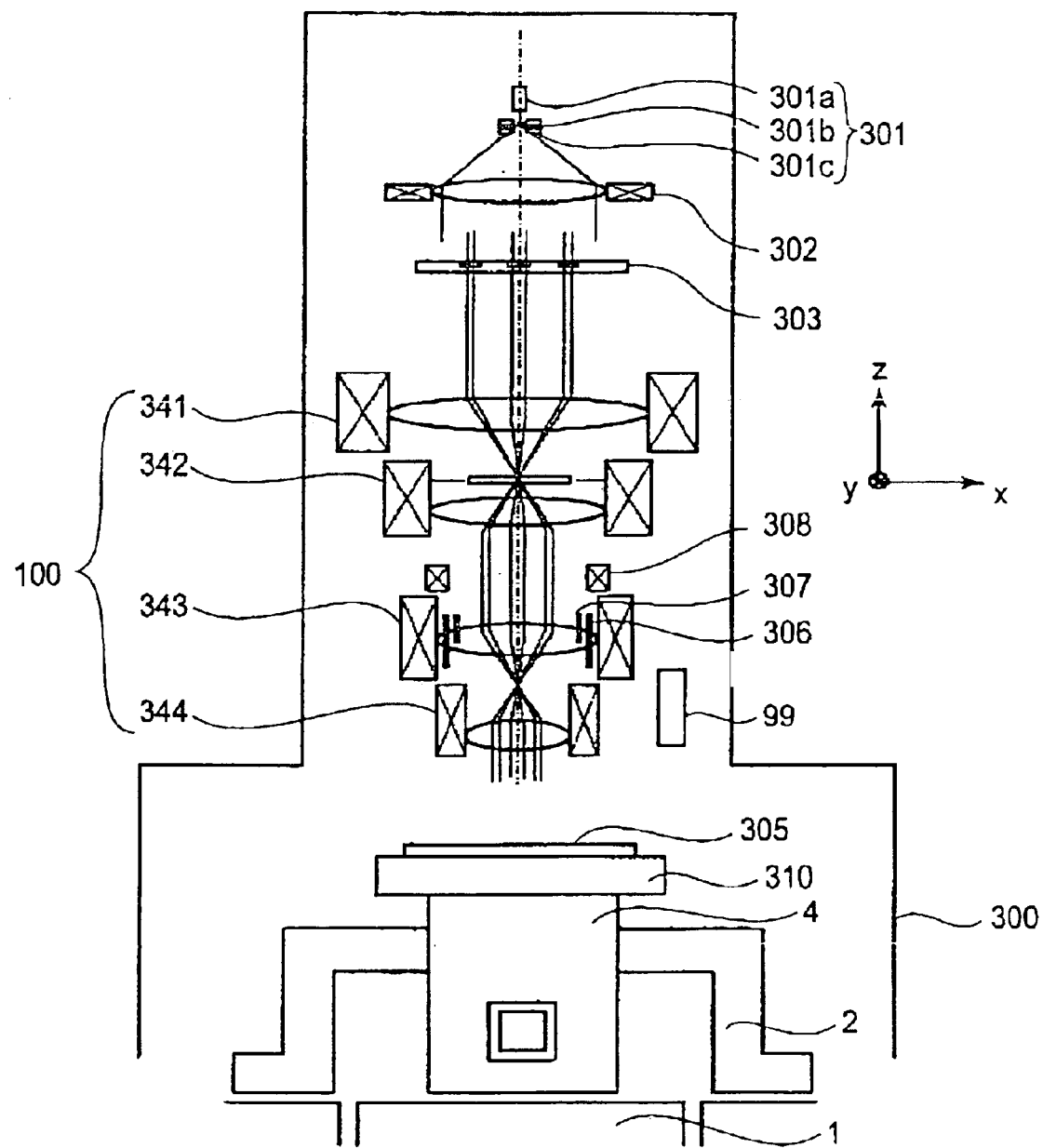
FIG. 1 is a schematic view of a main portion of an electron beam exposure apparatus according to an embodiment of the present invention.

The present invention may take the following preferred forms. That is, in a stage system in one preferred form of the present invention, a substrate (305) is disposed in a vacuum chamber (300) (reference numerals are those used in the embodiments to be described later) having a vacuum ambience or substantially vacuum ambience therein, and the stage system is movable in X and Y directions being orthogonal or approximately orthogonal to each other. The stage system comprises an X driving member (first driving member) (3) being movable along an X direction, a Y driving member (2) (second driving member) being movable along a Y direction, an X-Y movable member being movable in the Y direction relative to the X driving member, through a Y lateral static-pressure bearing (44) and also being movable in the X direction relative to the Y driving member and through an X lateral static-pressure bearing (45). The fluid discharged from the X lateral static-pressure bearing is combined with a fluid discharged from the Y lateral static-pressure bearing, and the combined fluid is discharged from a discharging bore formed in the X driving member.

In the preferred embodiments of the present invention to be described below, the X driving member and the Y driving member have the same function except that they drive the X-Y movable member in opposite directions. Therefore, while the following description will be made with reference to an example wherein a fluid mixed from the X driving member side is discharged, if the roles of the X driving member and the Y driving member with respect to the fluid are interchanged, it will be readily understood that a fluid can be discharged similarly from the Y driving member side. As a matter of course, such a case is clearly within the scope of the present invention. Further, in the following description, the term "Z direction" refers to a direction orthogonal to or approximately orthogonal to the X and Y directions.

Preferred embodiments of the present invention will now be described with reference to the attached drawings.

FIG. 1 is a schematic view of a main portion of an electron beam exposure apparatus according to an embodiment of the present invention. Denoted in FIG. 1 at 300 is a vacuum sample chamber, and denoted at 301 is an electron gun having a cathode 301a, a grid 301b and an anode 301c. Electrons emitted from the cathode 301a produce a crossover image between the grid 301b and the anode 301c (hereinafter, the crossover image will be referred to as a light source).

Electrons emitted from this light source are formed into an approximately parallel electron beam by means of a condenser lens 302 having a front focal point position placed at the light source position. The approximately parallel electron beam is then incident on an element electron optical system array 303. The element electron optical system array 303 includes a plurality of element electron optical systems each comprising a blanking electrode, an aperture and an electron lens. These element electron optical systems are arrayed along a direction perpendicular to the optical axis of a reduction electron optical system 100, which is parallel to the Z axis. Details of the element electron optical system array 303 will be described later.

The element electron optical system array 303 functions to produce a plurality of intermediate images of the light source, and these intermediate images are projected in a reduced scale by the reduction electron optical system 100, whereby light source images are formed upon a wafer 305. Here, the components of the element electron optical system array 303 are set so that the spacing of the light source images formed on the wafer 305 has a size corresponding to a multiple, by an integral number, of the size of the light source. Further, the element electron optical system 303 functions to assure that the positions of the light source images with respect to the optical axis direction are different in accordance with the field curvature of the reduction electron optical system 100. Also, the element electron optical system functions to correct aberration to be produced as the intermediate images are projected on the wafer 305 by the reduction electron optical system 100.

The reduction electron optical system 100 includes two-stage type symmetric magnetic tablets, comprising a first projection lens (341, 343) and a second projection lens (342, 344). When the focal length of the first projection lens (341, 343) is f1, while the focal length of the second projection lens (342, 344) is f2, the distance between these two lenses is equal to f1+f2.

The object point on the optical axis is at the focal point position of the first projection lens (341, 343), and the image point thereof is focused on the focal point of the second projection lens (342, 344). This image is reduced at −f2/f1. Also, since the magnetic fields of these two lenses are determined so that they act in mutually opposite directions, theoretically, except five aberrations of spherical aberration, isotropic astigmatism, isotropic coma aberration, field curvature aberration, and longitudinal chromatic aberration, the remaining Seidel's aberration and chromatic aberration concerning rotation and magnification can be cancelled.

Denoted at 306 is a deflector for deflecting plural electron beams from the element electron optical system array 303 so as to shift plural light source images upon the wafer 305 in the X and Y directions by the same displacement amount. While not shown in the drawing, the deflector 306 comprises a main deflector to be used when the deflection width is wide, and a sub-deflector to be used when the deflection width is narrow. The main deflector is an electromagnetic type deflector, while the sub-deflector is an electrostatic type deflector.

Denoted at 307 is a dynamic focus coil for correcting a deviation of the focus position of the light source image, based on deflection aberration to be produced when the deflector 306 is operated. Denoted at 308 is a dynamic coil which serves, like the dynamic focus coil 307, to correct astigmatism of deflection aberration to be produced by the deflection. Denoted at 99 is an alignment scope having an off-axis arrangement, for detecting a mark already formed on the wafer.

Denoted at 310 is a top stage for carrying a wafer 305 thereon. For observation of the whole surface of the wafer 305 through the alignment scope 99, the top stage 310 should have a stroke corresponding to the wafer diameter, just underneath the alignment scope 99.

Denoted at 4 is an X-Y slider for carrying the top stage 310 thereon and being movable in the X and Y directions, which are orthogonal to the optical axis (Z axis). The X-Y slider will be explained in greater detail, in conjunction with FIG. 2. The X-Y slider 4 comprises an X-Y slider-(y) 41 and an X-Y slider-(x) 42. At the bottom of the X-Y slider-(y) 41, there is a vacuum-proof bearing 43 disposed opposed to the top face 1*f* of a stage base 1. Also, inside the side wall of the X-Y slider-(y) 41, there is a similar vacuum-proof bearing 44 disposed to sandwich a Y guide 3*f*.

Figure 3:
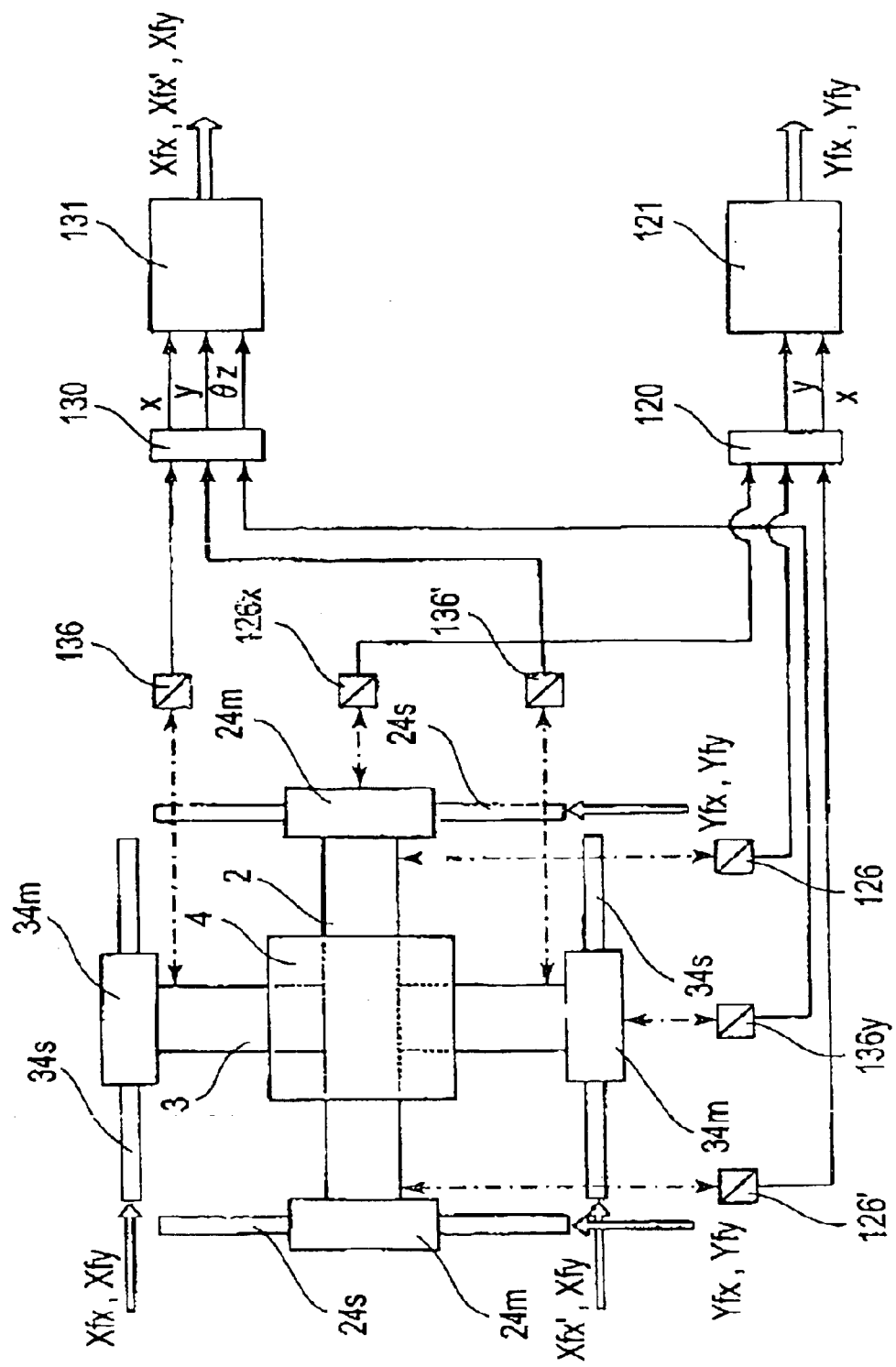
FIG. 3 is a diagram for explaining a stage control system of the stage system of the FIG. 2 example.

Further, inside the side wall of the X-Y slider-(x) 42, there is a similar vacuum-proof bearing 45 disposed to sandwich an X guide 2*f*. The Y guide 3*f* is formed at opposite side walls of an X beam 32 (providing X slider 3), in the lengthwise direction. The X guide 2*f* is formed at the opposite side walls of a Y beam (providing Y slider 2), in the lengthwise direction. The X slider 3 having the Y guide 3*f* and the Y slider 2 having the X guide 2*f* are formed in a grid-like shape as shown in FIG. 3.

When the X-Y slider 4 is to be moved in the X direction, the X slider 3 is moved in the X direction by which it can be moved smoothly along the X guide 2*f* and the stage base top face 1*f*. When the X-Y slider 4 is to be moved in the Y direction, the Y slider 2 is moved in the Y direction by which it can be moved smoothly along the Y guide 3*f* and the stage base top face 1*f*.

The Y slider 2 will now be explained. The Y slider 2 has a Y beam 22 including the X guide 2*f*, as well as a Y foot 21 and a Y foot 21' disposed on the opposite side with respect to the X direction. At the bottom of the Y foot 21 (21'), there is a vacuum-proof bearing 23 disposed opposed to the top face of beam base 1*b* (1*d*).

The top face of the beam base 1*b* (1*d*) is parallel to or approximately parallel to the stage base top face 1*f*. The Y slider 2 can move smoothly in the Y direction by a required stroke, within the range of the top face of the beam base 1*b* (1*d*), and also, it can move smoothly in the X direction and a rotational direction about the Z axis (hereinafter, "Z-axis rotational direction"). Thus, the Y slider 2 can move with a long stroke in the Y direction and with a short stroke in the X direction. Thus, adding the Z-axis rotational direction, it can move with three freedoms.

Also, there are linear motor movable elements 24*m* disposed at the opposite sides with respect to the X direction, for driving the Y slider 2 in the Y direction. Each linear motor movable element 24*m* contains a permanent magnet therein, and a magnetic shield cover is mounted thereon to prevent leakage of magnetic field into the stage space. A linear motor for moving the Y slider 2 in the X direction is also housed in the movable element 24*m*. Details will be described later, with reference to FIG. 4.

The Y foot 21 is provided with a reflection mirror 26 for measuring the position in the Y direction and a reflection mirror 26*x* for measuring the position in the X direction, while the Y foot 21' is provided with a reflection mirror 26' for measuring the position in the Y direction. Thus, by use of interferometer systems 126, 126' and 126*x*, the position (x, y, θz) of the Y slider 2 in the directions of X, Y and Z-axis rotation can be measured.

Similarly, the X slider 3 will now be described. The X slider 3 includes an X beam 32 having the Y guide 3*f*, and an X foot 31 and an X foot 31' disposed on opposite sides with respect to the Y direction. At the bottom of the X foot 31 (31'), there is a vacuum-proof bearing 33 disposed opposed to the top face of a beam base 1*a* (1*c*).

The top face of the beam base 1*a* (1*c*) is parallel to or approximately parallel to the stage base top face 1*f*. The X slider can move smoothly in the X direction by a required stroke, within the range of the top face of the beam base 1*a* (1*c*), and also, it can move smoothly in the Y direction and the Z-axis rotational direction. Thus, the X slider 3 can move with a long stroke in the X direction and with a short stroke in the Y direction. Thus, adding the Z-rotational direction, it can move with three freedoms. Also, there are linear motor movable elements 34*m* disposed at the opposite sides with respect to the Y direction, for driving the X slider in the X direction.

Each linear motor movable element 34*m* contains a permanent magnet therein, and a magnetic shield cover is mounted thereon to prevent leakage of magnetic field into the stage space. A linear motor for moving the X slider in the Y direction is also housed in the movable element 34*m*.

The X foot 31 is provided with a reflection mirror 36 for measuring the position in the X direction, while the X foot 31' is provided with a reflection mirror 36*y* for measuring the position in the Y direction and a reflection mirror 36' for measuring the position in the X direction. Thus, by use of interferometer systems 136, 136' and 136*y*, the position (x, y, θz) of the X slider 3 in the directions of X, Y and Z-axis rotation can be measured.

FIG. 3 is a diagram of a control system for the X and Y sliders. The values of the interferometer systems 136, 136' and 136*y* corresponding to the X slider 3 are converted by an X slider computing unit 130 into the X-direction position x, Y-direction position y and Z-axis rotational direction θz of the X slider 3, and they are applied as a feedback signal to an X slider controller 131. The X slider controller 131 calculates a driver designated value (Xfx, Xfx', Xfy) and, by applying an electrical current to a coil array provided in an associated X stator 34*s*, driving forces Xfx and Xfx' in the X and Z-axis rotational directions, as well as a driving force Xfy in the Y direction, are produced.

Similarly, the values of the interferometer systems 126, 126' and 126*x* corresponding to the Y slider 2 are converted by a Y slider computing unit 120 into the X-direction position x and Y-direction position y of the Y slider 2, and they are applied as a feedback signal to a Y slider controller 121. The Y slider controller 121 calculates a driver designated value (Yfy, Yfx) and, by applying an electrical current to a coil array provided in an associated Y stator 24*s*, driving forces Yfy in the Y direction as well as a driving force Yfx in the X direction are produced. In the control system of this embodiment, the Z-axis rotation of the X slider 3 is controllably confined, while the Z-axis rotation of the Y slider 2 follows the rotation of the X slider 3.

As described above, three freedoms of movement of the X slider and two freedoms of movement of the Y slider are controllably confined, by which three freedoms of movement of the X-Y slider 4 can be controlled. Here, the X-direction position of the X-Y slider 4 can be regarded as being substantially equivalent to the X-direction position of the X slider 3, and the Y-direction position of the X-Y slider can be regarded as being substantially equivalent to the Y-direction position of the Y slider 2. Also, the Z-axis rotation thereof can be regarded as being substantially equivalent to the Z-axis rotation of the X slider 3. Measurement for these rough-motion sliders can be performed in various combinations and, as an example, the X-Y slider 4 can be measured directly by use of an interferometer.

Further, while the positional information of the Y slider 2 regarding the rotational direction is not specifically used in this embodiment as a measured value, a control may be added by using velocity information in the rotational direction.

Referring now to FIGS. 4A and 4B, the linear motor to be used in the present invention will be explained while taking the linear motor 34 of the X slider 3 as an example. As described hereinbefore, the linear motor 34 has a movable element 34*m* and a stator 34*s*. The movable element 34*m* comprises a movable magnet 134*mag* and a magnetic shield 134*sh*. The stator 34 comprises coil arrays 134*a*, 13*b*, 134*c*, 134*d* and 134*e*, which are disposed along the stroke direction. Each coil has a two-layer structure. There is a jacket 134*j* for covering the coil arrays, to prevent the coil arrays from being bared inside the vacuum sample chamber. The movable magnet 134*mag* includes X-direction magnetized magnets, which are alternately sandwiched between Y-direction magnets, to provide a magnetic flux distribution near a sine wave in the coil space.

FIG. 4*a* illustrates a state in which a driving force acts in the X direction. A Y-direction largest magnetic flux By is being produced at the coil b. At this moment, by applying electrical currents of the same phase to the coils 134*b*_u and 134*b*_d, due to Lorentz's force, a force is applied to the movable element 34*m* in the X direction.

FIG. 4*b* illustrates a state in which a driving force acts in the Y direction. An X-direction largest magnetic flux Bx is being produced at the coil c, in opposite directions at the positions of the coils 134*b*_u and 134*b*_d. At this moment, by applying electrical currents of opposite phases to the coils 134*b*_u and 134*b*_d, due to Lorentz's force, a force is applied to the movable element 34*m* in the Y direction. Although this force in the Y direction may be weak as compared with the force in the X direction, there does not occur a particular problem, since the force in the Y direction is not used for acceleration of the X slider.

Figure 5:
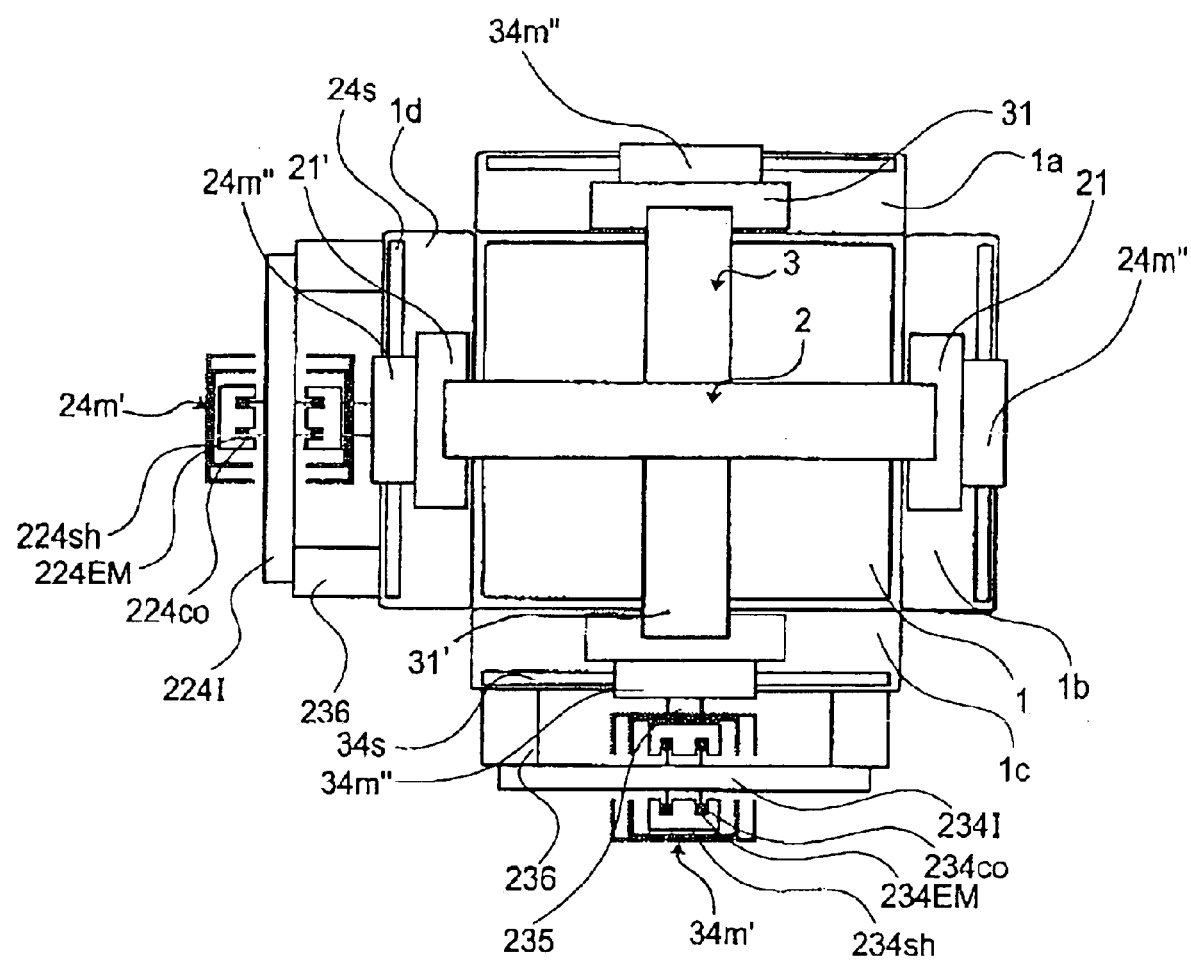
FIG. 5 is a schematic view of a stage system according to a second embodiment of the present invention.

FIG. 5 illustrates an electromagnet arrangement as a second embodiment, for applying a driving force in the Y direction for the X slider and a driving force in the X direction for the Y slider. The X foot 31 and X foot 31' of the X slider 3 are provided with a linear motor movable element 34*m"* for applying an X-direction driving force and, additionally, the X foot 31' is provided with an electromagnet unit 34*m'* for applying a Y-direction driving force. The electromagnet unit 34*m'* includes an E-shaped core 234EM, a coil 234*co* and a magnetic shield 234*sh*, at the movable side, which are fixed to the X foot 31' by a non-magnetic material 235. Also, there is a magnetic material bar 234I at the fixed side, which is fixed to the beam base 1*c* by a non-magnetic material 236. In the electromagnetic unit 34*m'*, the X slider 3 can be driven in the Y direction by selectively applying and controlling a voltage to opposed coils.

The Y foot 21 and the Y foot 21' of the Y slider are provided with a linear motor movable element 24*m"* for applying a Y-direction driving force and, additionally, the Y foot 31' is provided with an electromagnet unit 24*m'* for applying an X-direction driving force. The electromagnet unit 24*m'* includes an E-shaped core 224EM, a coil 224*co* and a magnetic shield 224*sh*, at the movable side, which are fixed to the Y foot 21' by a non-magnetic material 235. Also, there is a magnetic material bar (I-shaped core) 224I at the fixed side, which is fixed to the beam base 1*d* by an I-shaped core mounting member 236 made of a non-magnetic material. In the electromagnetic unit 24*m'*, the Y slider 2 can be driven in the X direction by selectively applying and controlling a voltage to opposed coils.

Referring now to FIGS. 6A–6D, the structure at the bottom faces of the sliders will be explained. FIG. 6A illustrates the whole structure as viewed from the bottom, for explaining the base arrangement for supporting the sliders. FIG. 6B illustrates a single bottom pad. As has been described with reference to FIG. 2, at the bottom of the X-Y slider-(y) 41, there is a vacuum-proof bearing 43 disposed opposed to the top surface 1*f* of the stage base 1. At the bottom of the Y foot 21 (21'), there is a vacuum-proof bearing 23 disposed opposed to the top surface of the beam base 1b (1d). At the bottom of the X foot 31 (31'), there is a vacuum-proof bearing 33 disposed opposed to the top surface of the beam base 1a (1c). Details of such pads are such as shown in FIG. 6B. Specifically, each pad comprises a static-pressure bearing portion 51 in which a fluid is discharged through a porous material, a labyrinth portion 52 for preventing leakage of the discharged fluid into the ambience, and an exhaust bore 53. The labyrinth portion includes a plurality of lands 52L and grooves 52g, for providing a fluid resistance without contact.

In order to attain a desired rigidity in a static-pressure bearing, generally, a preload is applied to the static-pressure bearing. In this embodiment, a preload is applied on the basis of an attraction force of a permanent magnet. The preload application may be made by a simple float-type preload, such as a vacuum preload (in a case wherein the ambience is at atmosphere or a reduced pressure ambience) or a magnetic preload, or a confinement-type load, in which a preload is applied, while a static-pressure bearing is disposed opposed.

Figure 2:
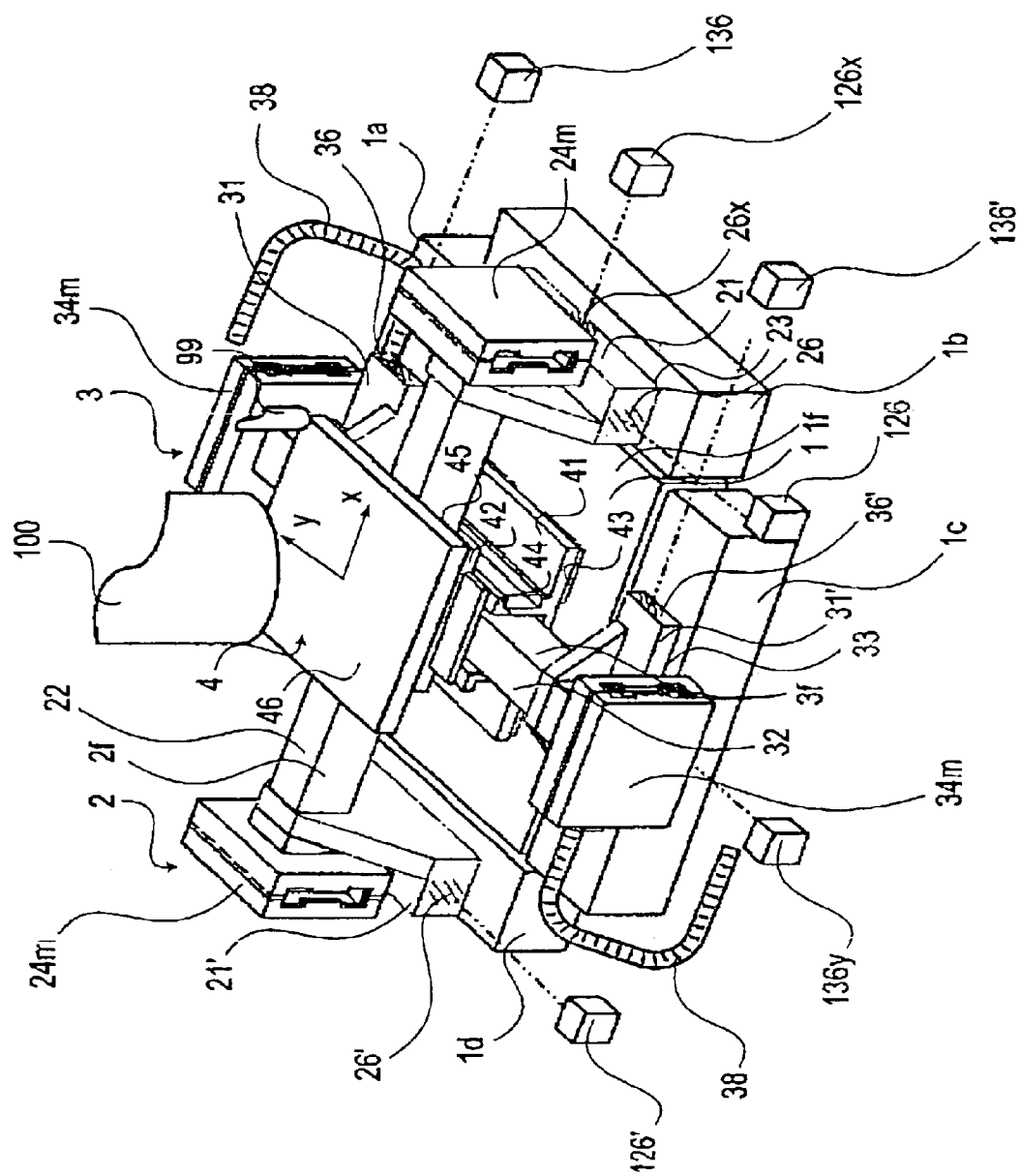
FIG. 2 is a perspective view of a main portion of a stage system in the FIG. 1 embodiment.

In this embodiment, since the system is used in a vacuum ambience, the simple float-type preload based on a magnetic preload is used. In FIG. 6, denoted at 29 is a permanent magnet fixed to the Y foot, and denoted at 39 is a permanent magnet fixed to the X foot. Denoted at 49 is a permanent magnet fixed to the X-Y slider-(y) 41 (FIG. 2). These magnets are covered by magnetic shields 29sh, 39sh and 49sh, for preventing leakage of their magnetic field. Since the confinement-type preload is not used, only the bearing surface and the guide surface are the precision required surface.

On the other hand, a structure as a confinement-type preload is used as shown in FIG. 2, that is, a vacuum-proof bearing 45 is provided at the opposite sides of the inside wall of the X-Y slider-(x) 42 to sandwich the opposed X guide 2f therebetween. On that occasion, regarding the precision required surface, the parallelism of the opposite sides of the bearing 45 at the X-Y slider side, as well as the parallelism of the opposite faces of the X guide 2f, should be controlled. However, the rigidity will be improved in this case.

Further, when permanent magnets are used in an electron beam apparatus, as in the present embodiment, in addition to covering each permanent magnet by use of a magnetic shield, the following measure may be done. That is, in FIG. 6A, the bases (1, 1a, 1b, 1c, 1d) of magnetic materials, which are the object to be attracted by the respective permanent magnets, are magnetically isolated from each other.

More specifically, the preload magnet 49 of the X-Y slider is disposed opposed to the stage base 1, and the preload magnet 29 of the Y slider is disposed opposed to the beam base 1b (1d). The preload magnet 39 of the X slider is disposed opposed to the beam base 1a (1c). The bases 1, 1a, 1b, 1c and 1d of them are disposed with a certain mutual magnetic resistance.

The effect of this structure will be explained, in conjunction with FIGS. 6C and 6D. FIG. 6C shows a case wherein the bases are not magnetically isolated, and FIG. 6D shows a case wherein the bases are isolated. If they are not isolated, in addition to magnetic circuits L1 produced by the respective magnets, a magnetic circuit L2 is produced between plural magnets and this leaks outwardly beyond the shields 29sh, 39sh and 49sh. On the other hand, if magnetic isolation is provided (that is, the magnetic resistance is enlarged sufficiently high), the magnetic flux leakage between plural magnets can be reduced as much as possible.

Figure 7:
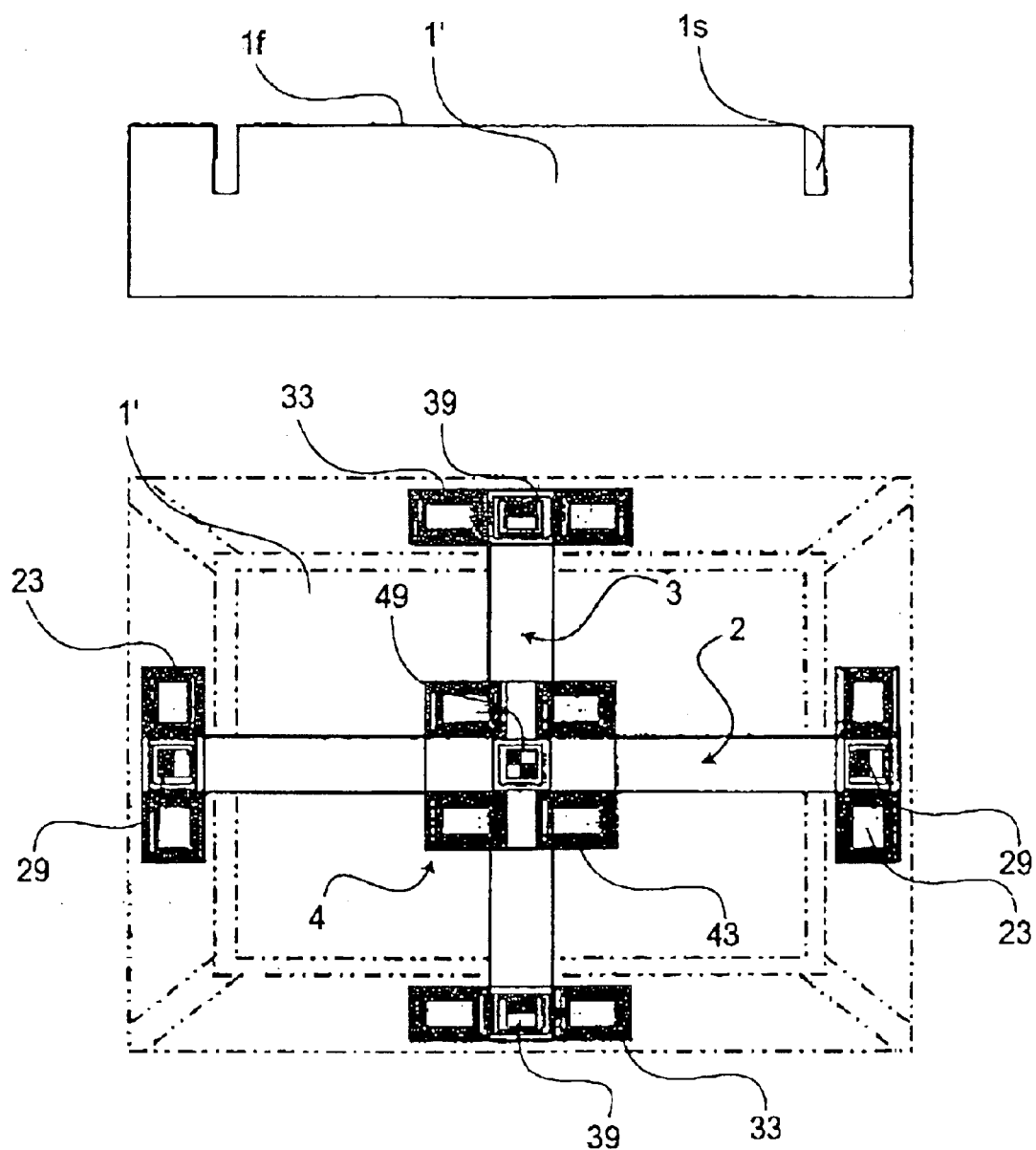
FIG. 7 is a schematic view for explaining another example of the base arrangement.

FIG. 7 illustrates the base arrangement according to a second embodiment, as viewed from the bottom. In FIG. 7, the base 1' to which the respective permanent magnets are disposed opposed is formed integrally. There is a slit 1s between movable regions of the sliders, to increase the magnetic resistance between plural magnets, such that magnetic flux leakage to be produced between plural magnets is minimized. In the arrangement of FIG. 7, the precision setting at the guide surface 1f of the base 1' is easy.

Figure 8A:
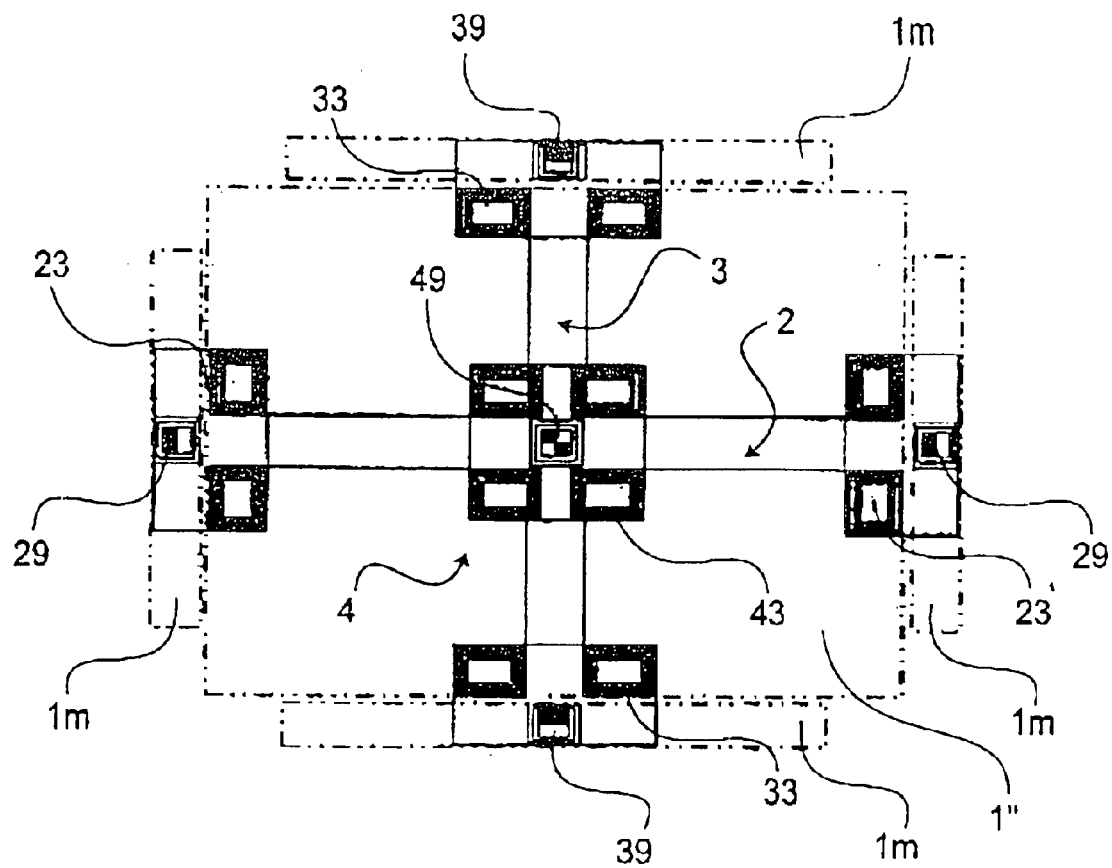
FIGS. 8A and 8B are schematic views, explaining a further example of the base arrangement.

FIG. 8A shows the base arrangement according to a third embodiment, as viewed from the bottom. In FIG. 8A, in the bottom pad movable region of each slider, provided are a common base 1" and the magnetic material base 1m to which the permanent magnets 29 and 39 of the sliders 2 and 3 are magnetically isolated from each other.

Figure 8B:
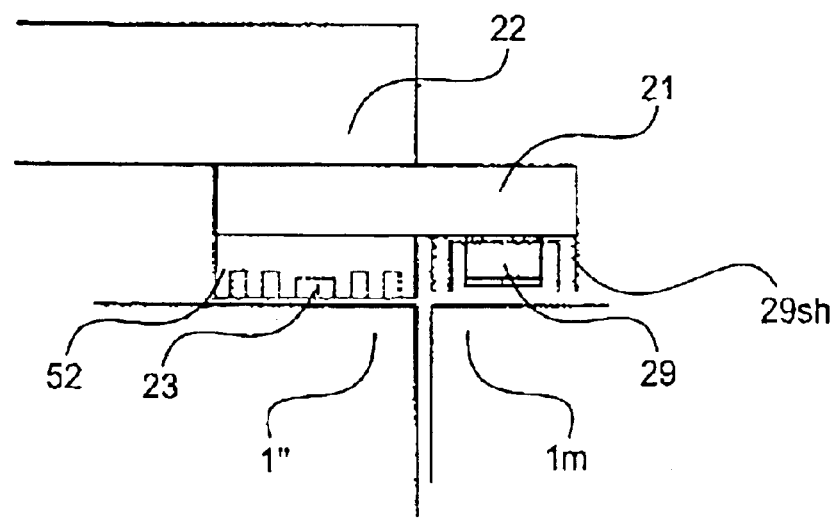

FIG. 8B illustrates the Y foot 21 as seen from the side thereof. The Y-bottom pad 23, including a labyrinth portion, uses the top face 1f of the common base 1" as a guide surface. The attracting permanent magnet 29 for applying a preload to the Y-bottom pad 23 and the magnetic shield 29sh are disposed opposed to the magnetic material base 1m being magnetically isolated from the common base 1".

As shown in FIG. 8A, while the attracting magnet of the X-Y slider 4 is disposed opposed to the common base 1", since the common base 1" and the magnetic material base 1m are magnetically isolated from each other, magnetic flux leakage to be produced between plural magnets can be reduced as much as possible. Furthermore, generally, the flatness precision may be looser at the surface opposed to the permanent magnet than at the surface to be opposed to the bearing portion, and, therefore, the arrangement is advantageous with respect to machining and assembling.

Figure 9A:
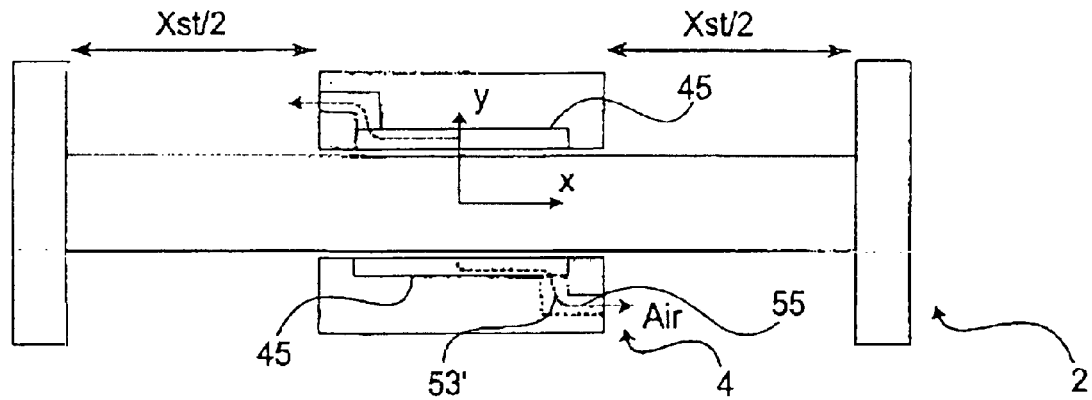
FIGS. 9A and 9B illustrate an exhausting structure in the stage system of FIG. 2.
Figure 9B:
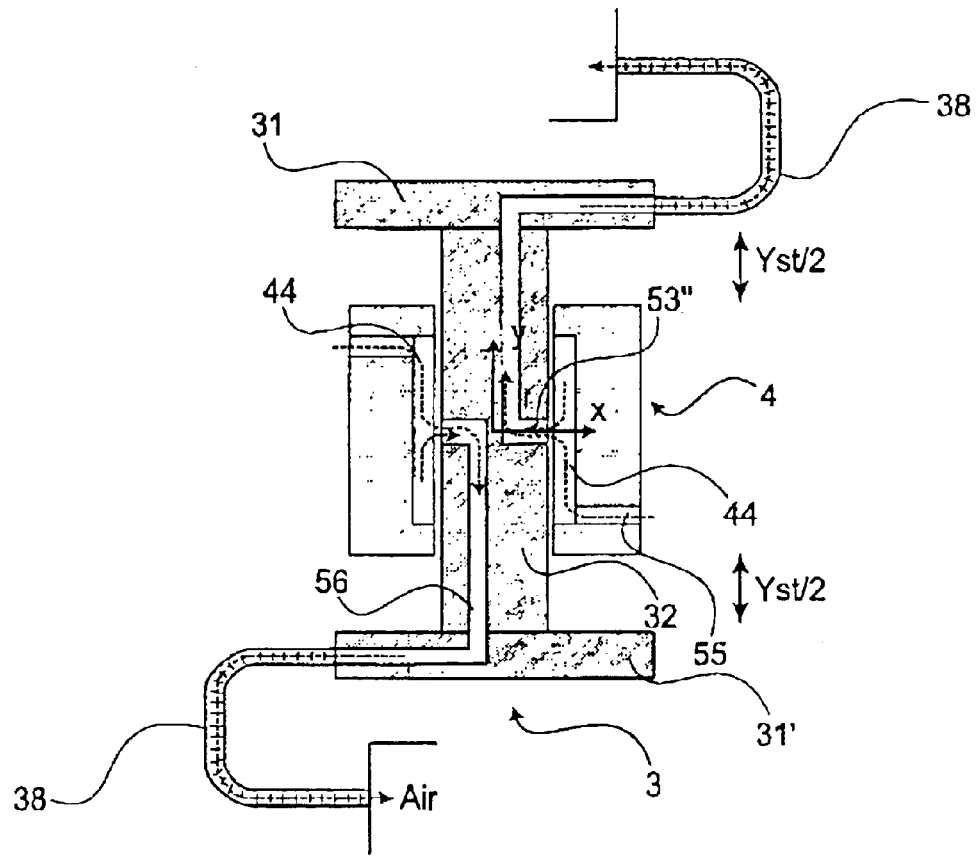
Figure 10:
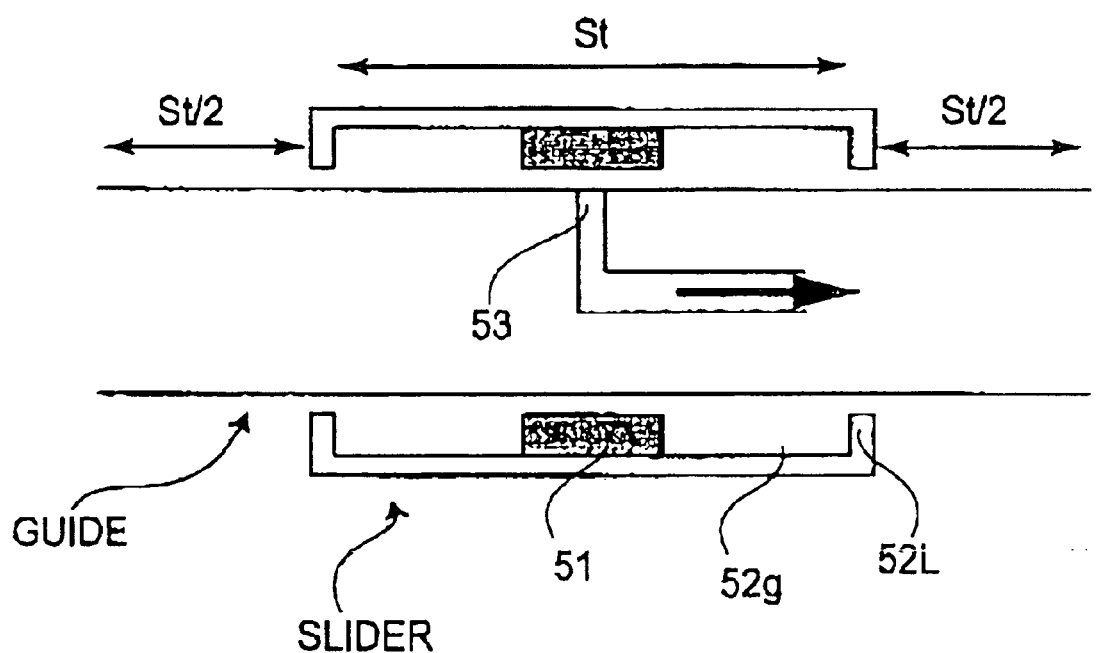
FIG. 10 is a schematic view of a conventional exhaust type air bearing.
Figure 11:
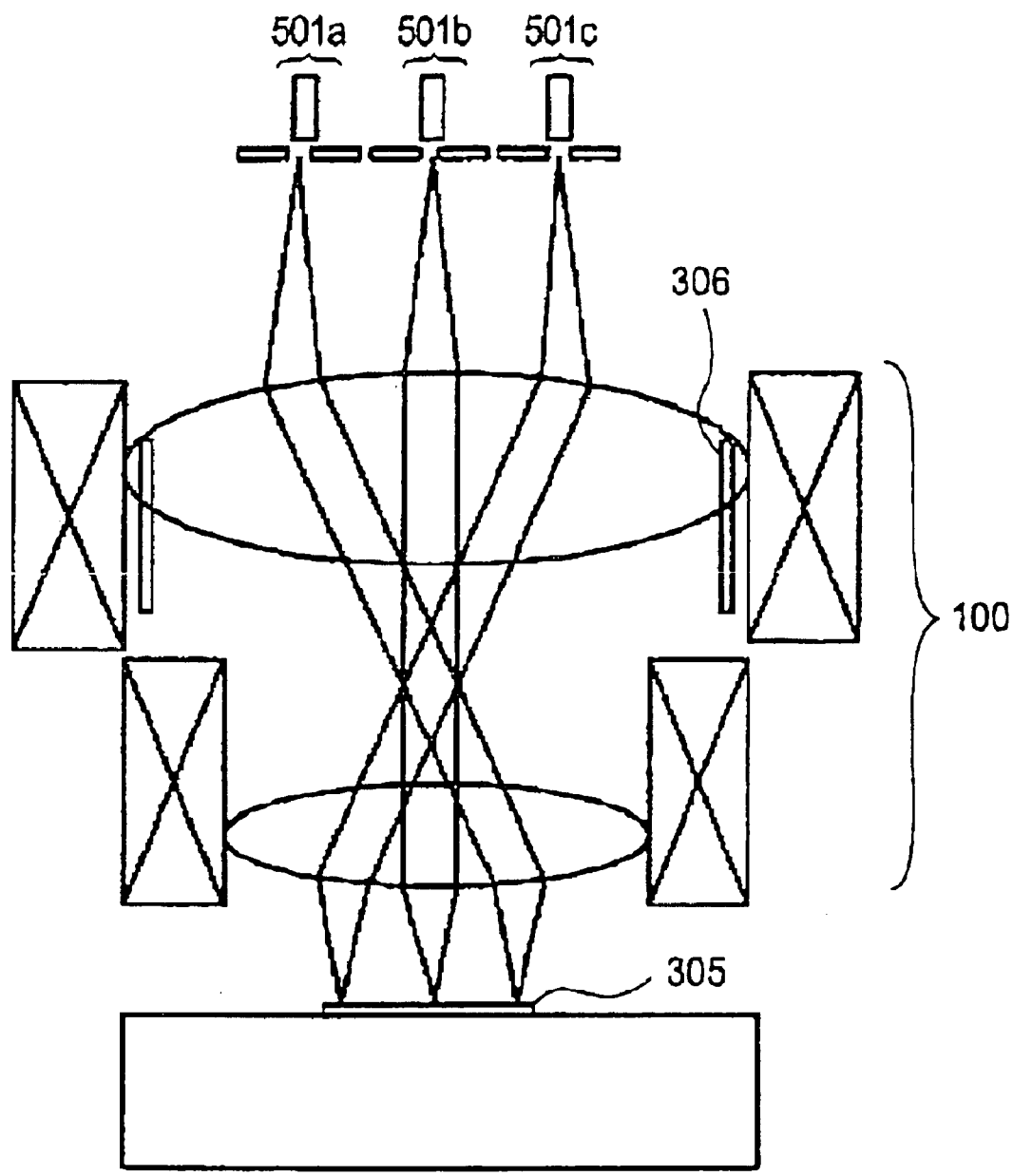
FIG. 11 is a schematic view of a general structure of a multiple electron-beam exposure apparatus.

FIGS. 9A and 9B are schematic views for explaining the flow of fluids collected by exhaust bores 53' and 53" of lateral pads 44 and 45 of the X-Y slider 4. In the electron beam exposure apparatus according to this embodiment of the present invention, as has been described with reference to FIGS. 1 and 2, an alignment scope 99 is disposed in the X direction such that, for observation of the whole surface of the wafer through the alignment scope, the top stage should have a stroke, just below the alignment scope, that corresponds to the wafer diameter. The distance from the center of the projection optical system to the alignment scope is called a "base line", and, in this arrangement, the X-direction stroke Xst is longer than the Y-direction stroke Yst by the base line (i.e., Xst>Yst). Thus, the following measures are taken in this embodiment.

The fluid discharged from the Y lateral pad 45 is collected by the exhaust bore 53' formed in the labyrinth portion groove 52g (FIG. 6). The collected fluid is discharged to the labyrinth portion groove 52g of the X lateral pad 44 through a pipe 55 provided in the X-Y slider 4 and the X lateral pad 44. The thus discharged fluid and the fluid discharged from the X lateral pad 44 are mixed with each other. The thus combined fluid is collected through an exhaust bore 53" formed in the X beam 32. The collected fluid is discharged outwardly of the vacuum sample chamber 300 (FIG. 1) through a pipe 56 formed in the X beam 32 and the X foot 31 (31') and from a flexible tube 38 connected to the X foot 31 (31').

The labyrinth portion groove 52g of the Y lateral pad 44 should have a length the same as or larger than the Y-direction stroke Yst. Although the X-direction stroke is still longer, since, in this embodiment, the fluid discharged from the X lateral pad 45 is collected at the X-Y slider 4 side, it is not necessary for the labyrinth portion groove 52g of the X lateral pad to have a length the same as the X-direction stroke Xst. Therefore, the size of the X-Y slider structure including the lateral pads 44 and 45 can be held to be small.

Here, it should be noted that, in place of providing the exhaust bore 53" in the X beam 32, an exhaust bore 53" may be formed in the Y beam 22 while an exhaust bore 53' may be provided in the labyrinth portion groove 52g of the X lateral pad 44, to provide a reverse structure to the example shown ion FIG. 9. On that occasion, the fluid is discharged to the labyrinth portion groove 52g of the Y lateral pad 45.

In such a case, the discharged fluid and the fluid discharged from the Y lateral pad 45 are mixed with each other inside the labyrinth portion groove 52g of the Y lateral pad 45. The thus combined fluid is collected through an exhaust bore 53" provided in the Y beam 22, and, like the foregoing example, it is discharged out of the vacuum sample chamber 300 through a flexible tube 38.

Next, semiconductor device manufacturing processes using an exposure apparatus described above, will be explained.

Figure 13:
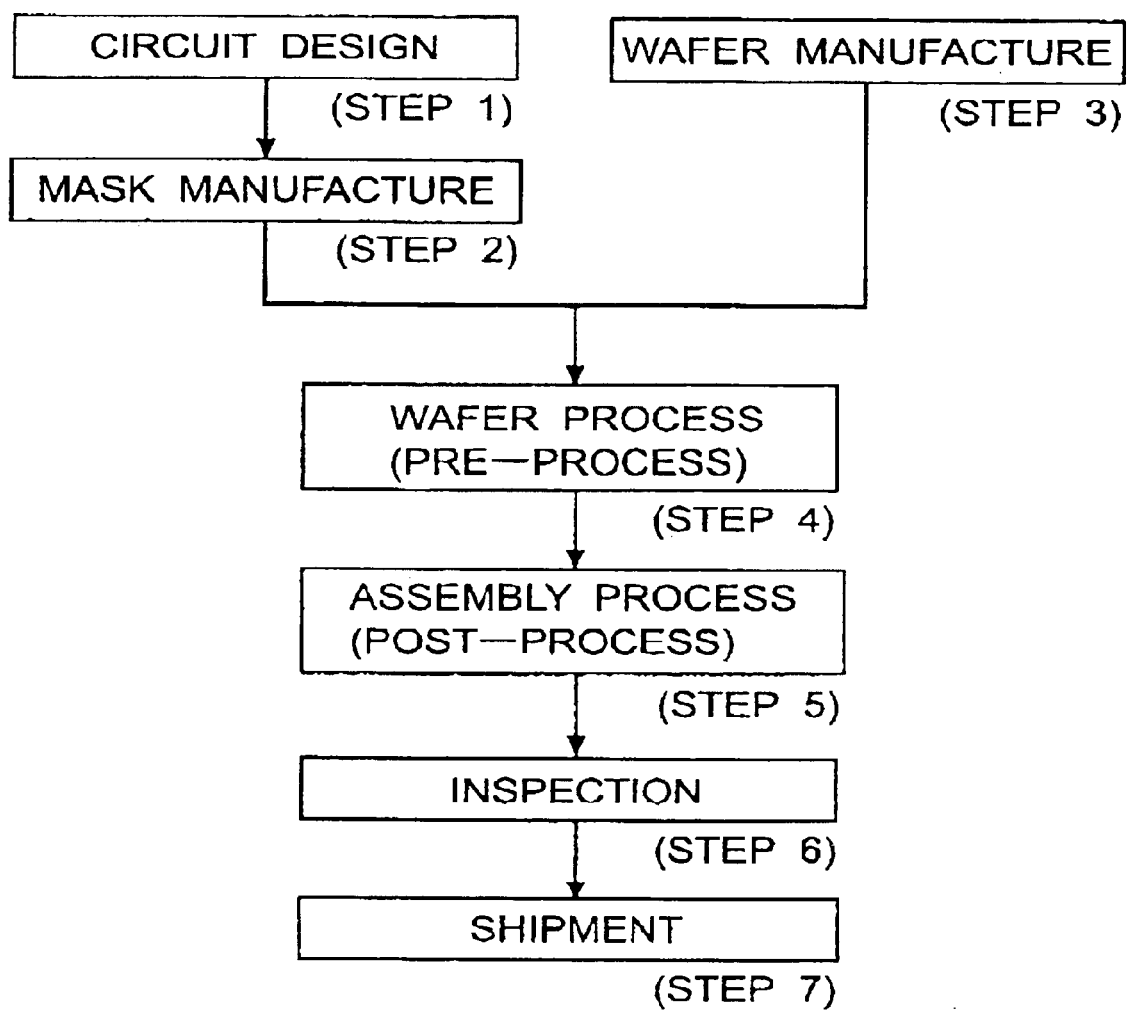
FIG. 13 is a flow chart for explaining device manufacturing processes.

FIG. 13 is a flow chart for explaining a general procedure for manufacturing semiconductor devices. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process, which is called a pre-process wherein, by using the thus prepared mask and wafer, a circuit is formed on the wafer in practice, in accordance with lithography. Step 5 subsequent to this is an assembling step, which is called a post-process, wherein the wafer having been processed at step 4 is formed into semiconductor chips. This step includes an assembling (dicing and bonding) process and a packaging (chip sealing) process. Step 6 is an inspection step wherein an operation check, a durability check and so on, for the semiconductor devices produced by step 5, are carried out. With these processes, semiconductor devices are produced, and they are shipped (step 7).

Step 4 described above includes an oxidation process for oxidizing the surface of a wafer, a CVD process for forming an insulating film on the wafer surface, an electrode forming process for forming electrodes upon the wafer by vapor deposition, an ion implanting process for implanting ions to the wafer, a resist process for applying a resist (photosensitive material) to the wafer, an exposure process for printing, by exposure, the circuit pattern of the mask on the wafer through the exposure apparatus described above, a developing process for developing the exposed wafer, an etching process for removing portions other than the developed resist image, and a resist separation process for separating the resist material remaining on the wafer after being subjected to the etching process. By repeating these processes, circuit patterns are superposedly formed on the wafer.

Although the foregoing description has been made with reference to examples in which the present invention is applied to an electron beam exposure apparatus, with appropriate modification of the structure, the present invention can be applied to a vacuum-ambience exposure apparatus that does not use an electron beam, for example, an EUV exposure apparatus in which EUV (extreme ultraviolet) light is used as exposure light. Furthermore, the stage of the present invention can be used not only in a vacuum, but also in a desired gas ambience.

If an electron beam is not used, since it is not necessary to consider the problem of a change in magnetic field in that case, there is no necessity of providing a magnetic shield to the linear motor or the permanent magnet. Further, it is unnecessary to magnetically isolate the base tables (bases) from each other.

On the other hand, even in an electron beam exposure apparatus, when the X slider and/or the Y slider is made on the basis of the confinement-type preload as described hereinbefore, it is not necessary to magnetically isolate the base tables from each other.

While the invention has been described with reference to the structures disclosed herein, it is not confined to the details set forth and this application is intended to cover such modifications or changes as may come within the purposes of the improvements or of the following claims.

What is claimed is:

1. A stage system, comprising:
   a first driving member being movable along a first direction;
   a second driving member being movable along a second direction orthogonal to the first direction;
   a movable member being movable in the second direction along a first guide surface provided on the first driving member, while being supported with respect to the first guide surface through a first static-pressure bearing, said movable member further being movable in the first direction along a second guide surface provided on the second driving member, while being supported with respect to the second guide surface through a second static-pressure bearing; and
   fluid discharging means for combining a fluid discharged from said second static-pressure bearing with a fluid discharged from said first static-pressure bearing, and for discharging the combined fluid from a discharging bore formed in said first driving member.

2. A stage system according to claim 1, wherein a movement range of the movable member in the first direction is longer than that in the second direction.

3. A stage system according to claim 1, wherein said fluid discharging means collects the fluid discharged from said second static-pressure bearing through a second discharging groove provided around said second static-pressure bearing, and the collected fluid is combined in a first discharging groove provided around said first static-pressure bearing.

4. A stage system according to claim 1, wherein said stage system is disposed in a vacuum chamber, and said fluid discharging means discharges the combined fluid outwardly from said vacuum chamber through a flexible tube connected to said discharging bore.

5. A stage system according to claim 1, wherein, for printing a pattern on a substrate in a vacuum chamber, said stage system moves said movable member two-dimensionally while carrying the substrate thereon.

6. A stage system according to claim 5, wherein the patterning process for printing the pattern on the substrate is performed mainly during constant-speed run of the movable member in the second direction.

7. An exposure apparatus including a stage system as recited in claim 1, for positioning at least one of an original and a substrate.

8. A device manufacturing method including a process for manufacturing a device by use of an exposure apparatus as recited in claim 7.

* * * * *